United States Patent [19]
Marandi et al.

[11] Patent Number: 6,081,565
[45] Date of Patent: Jun. 27, 2000

[54] AMPLITUDE BASED COARSE AUTOMATIC GAIN CONTROL CIRCUIT

[75] Inventors: Vahid Marandi, Mission Viejo, Calif.; Mohammad Shafiul Mobin, Whitehall, Pa.; Kalyan Mondal, Berkeley Heights, N.J.; Akkas T. Sufi, Laurys Station, Pa.

[73] Assignee: Lucent Technologies Inc., Murray Hill, N.J.

[21] Appl. No.: 09/019,320

[22] Filed: Feb. 5, 1998

Related U.S. Application Data

[60] Provisional application No. 60/055,695, Jul. 15, 1997.

[51] Int. Cl.$^7$ .............................. H04L 27/08; H03G 3/20; H04B 1/06; H04N 5/52

[52] U.S. Cl. ...................... 375/345; 333/128; 455/234.1; 348/678

[58] Field of Search .............................. 375/345; 330/128, 330/129, 254, 278; 455/219, 232.1, 234.1, 240.1; 348/678; 342/89, 91, 92

[56] References Cited

U.S. PATENT DOCUMENTS

| | | | |
|---|---|---|---|
| 5,220,564 | 6/1993 | Tuch et al. .............................. | 370/338 |
| 5,519,441 | 5/1996 | Gusmano et al. ....................... | 348/207 |
| 5,563,916 | 10/1996 | Scarpa ..................................... | 375/345 |
| 5,565,932 | 10/1996 | Citta et al. .............................. | 348/678 |
| 5,841,820 | 11/1998 | Krishnamurthy et al. .............. | 375/345 |

*Primary Examiner*—Chi H. Pham
*Assistant Examiner*—Khai Tran
*Attorney, Agent, or Firm*—John P. Veschi

[57] ABSTRACT

A digital automatic gain control circuit for a receiver includes an averaging block and an adjustment block. The averaging block receives a length of a digital sample stream that represents an incoming analog signal and produces an absolute average signal. The adjustment block receives the absolute average signal and a reference signal and outputs an adjustment signal for controlling gain. The adjustment signal is based on a difference between the absolute average signal and the reference signal. In an alternative embodiment, a method of controlling gain according to the invention includes the steps of calculating an absolute average of an incoming signal, and comparing the absolute average to a reference to produce an adjustment signal based on a difference between the absolute average and the reference.

25 Claims, 3 Drawing Sheets

AMPLITUDE BASED COARSE AUTOMATIC GAIN CONTROL CIRCUIT

Priority of U.S. Provisional application Ser. No.: 60/055,695, filed Jul. 15, 1997, is hereby claimed.

This application is related to Application No. 09/114,949, entitled "Fixed Clock Based Arbitrary Symbol Rate Timing Recover Loop," (Marandi 2-30-4-1), Application No. 09/019,402, entitled "Power Based Digital Automatic Gain Control Circuit", (Mobin 32-4), Application No. 09/114,998, entitled "Variable Baudrate Demodulator," (Farrow 31-29-3-7-2), and Application No. 08/993,465, entitled "Equalization Circuit for Unknown QAM Constellation Size", (Forrokh 1-1-9-2), each co-filed herewith and incorporated herein by reference.

BACKGROUND OF THE INVENTION

When receiving an analog signal, such as a quadrature amplitude modulated (QAM) signal, a digital system typically incorporates an analog-to-digital converter to digitize the input analog signal. For example, the analog-to-digital converter can convert samples of the input analog signal to multibit digital format, such as, for example, 10-bit two's complement format. When performing this analog-to-digital conversion, it is preferable for the input analog signal to have peak amplitudes which cover most of the input dynamic range of the analog-to-digital converter. If the signal swings beyond the dynamic range, saturation will occur, resulting in a loss of information. Conversely, if the signal swing is significantly below the limits of the dynamic range of the converter, the quantization error will increase, resulting in less information to be digitally processed. Thus, the desire of a coarse automatic gain control (AGC) unit is to keep the analog-to-digital converter's input signal near a desired level.

SUMMARY OF THE INVENTION

An automatic gain control circuit according to the invention includes an averaging block and an adjustment block. The averaging block receives a length of a digital sample stream that represents an incoming analog signal and produces an absolute average signal as an average of the absolute values of the samples in the length of the digital sample stream. The adjustment block receives the absolute average signal and a reference signal and outputs an adjustment signal. The adjustment signal is based on a difference between the absolute average signal and the reference signal.

Alternatively, a method of controlling gain according to the invention includes the steps of calculating an absolute average of an incoming signal, and comparing the absolute average to a reference to produce an adjustment value based on a difference between the absolute average and the reference.

DETAILED DESCRIPTION

Figure 1:
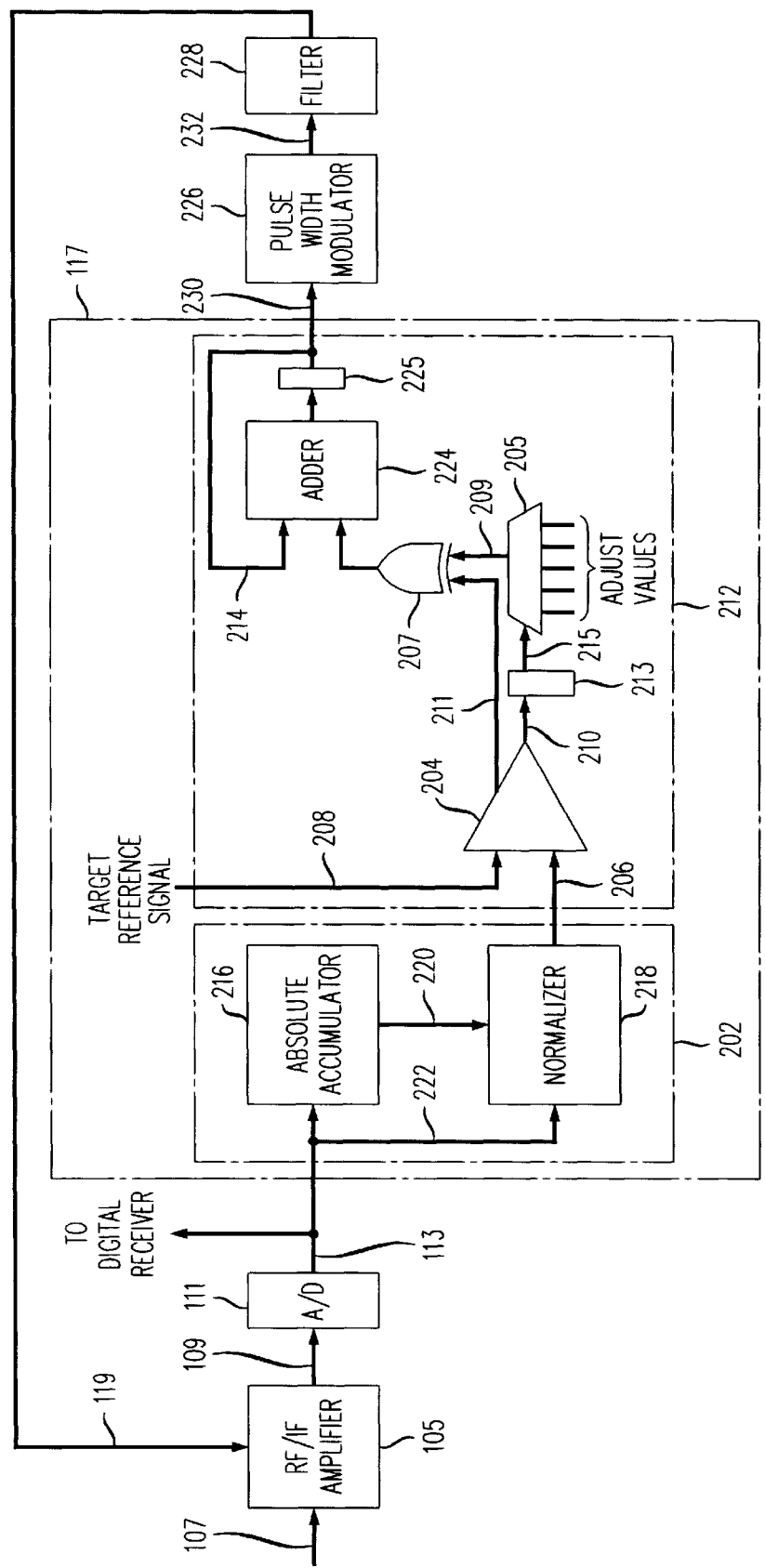
FIG. 1 is a simplified block diagram showing a first embodiment according to the invention.

The circuit of FIG. 1 shows a receiver, such as an integrated circuit based receiver, employing a first exemplary embodiment according to the invention. RF/IF amplifier 105 adjusts the gain of an incoming signal received via line 107 and outputs a gain adjusted signal on line 109. Analog-to-digital converter 111 receives the gain adjusted signal and outputs digital samples onto line 113 for processing by digital receiver 115. Coarse AGC circuit 117, according to one exemplary embodiment of the invention, receives the digital samples from analog-to-digital converter 111 on line 113 and outputs a control signal on line 119 for use by RF/IF amplifier 105 in adjusting the gain of the gain adjusted signal output on line 109. According to the invention, the control signal on line 119 causes RF/IF amplifier 105 to adjust the amplitude of the gain adjusted signal on line 109 to vary over most of the allowable dynamic range of analog-to-digital converter 111, thereby decreasing quantization error and avoiding saturation.

Coarse AGC circuit 117 includes an averaging block 202 and an updating circuit 212. Averaging block 202 receives a length of a digital sample stream on line 113 and produces an absolute average signal which is provided on line 206. Updating circuit 212 receives the absolute average signal on line 206 and also receives a reference (target) signal on line 208. Updating circuit 212 stores a gain value in register 225 and outputs a corresponding gain signal on line 230 to pulse width modulator 226. Pulse width modulator 226 outputs a PWM signal on line 232 to filter 228. Filter 228 provides a DC signal on line 119 to control an IF portion of RF/IF amplifier 105.

Averaging block 202 includes accumulator 216 and normalizer 218. Accumulator 216 receives the digital sample stream on line 113 and accumulates, for example, for a specified block of the digital sample stream, an absolute accumulation value as an accumulation of the absolute values of the digital samples. After accumulator 216 accumulates the sample values for the samples in the block, an absolute accumulation signal corresponding to the absolute accumulation value is provided on line 220. The absolute accumulation value is an algebraic sum of an absolute value representing each sample in the block of samples. The absolute accumulation signal provided on line 220 is received by normalizer 218.

Normalizer 218 adjusts the absolute accumulation signal to produce an absolute average signal which is output on line 206. Normalizer 218 adjusts the absolute accumulation signal based on the number of absolute values accumulated by absolute accumulator 216, which is equal to the number of samples in the block of samples. In one embodiment, normalizer 218 accomplishes the adjustment to the absolute accumulation signal by shifting the absolute accumulation signal according to the number of samples accumulated in absolute accumulator 216. Line 222 is shown for providing normalizer 218 with the digital sample stream that is provided to absolute accumulator 216 on line 113 for the purpose of enabling normalizer 218 to determine the number of samples accumulated. This connection is, of course, merely by way of example, providing normalizer 218 with the ability to count the samples contained in the block of samples in order to determine the magnitude of adjustment, such as, for example, the number of bits by which to shift the absolute accumulation signal provided on line 220 to produce the absolute average signal on line 206.

Updating circuit 212 includes comparator 204, multiplexer 205, +/− selector 207, range searcher 213, adder 224 and register 225. Comparator 204 receives the target reference signal on line 208 and compares the target reference signal to the absolute average signal received on line 206. Comparator 204 produces an error signal which is provided on line 210 to range searcher 213. Range searcher 213 performs a range search based on the magnitude of the error signal and provides a control signal to a controlling input of multiplexer 205 via line 215. Multiplexer 205 selects one of a plurality of adjustment values based on the control signal, and outputs the selected adjustment value on line 209. Selector 207 adjusts the sign of the adjustment value based on a sign bit received from comparator 204 on line 211. Selector 207 is configured, for example, as an exclusive-OR gate receiving the adjustment value from line 209 at one input, and receiving a sign bit from line 211 on another input.

Operationally, if the target reference value is greater than the absolute average value (indicating that the absolute average value is too low), then comparator 204 will produce a positive error value, the magnitude of which is provided to range searcher 213 via line 210, and the sign of which is provided to selector 207 in the form of a logic 0. Range searcher 213 determines a range of the magnitude of the error signal and provides a corresponding control signal to multiplexer 205, which outputs a corresponding adjustment value. In this case, selector 207 performs an exclusive-OR operation between the adjustment value provided by multiplexer 205 on line 209 and the logic 0 value provided on line 211, thereby having no effect on the adjustment value, and causing the adjustment value to be added to a previous gain value by adder 224.

Alternatively, if the target reference value is less than the absolute average value (indicating that the absolute average value is too high), then comparator 204 will produce a negative error value, the magnitude of which is provided to range searcher 213 via line 210 and the sign of which is provided to selector 207 in the form of a logic 1. In this case, selector 207 performs an exclusive-OR operation between the adjustment value provided by multiplexer 205 based on a controlling input received from range searcher 213 and the logic 1 value provided on line 211, thereby producing a complement of the adjustment value, and causing the adjustment value to be subtracted from a previous gain value by adder 224.

According to the invention, the plurality of adjustment values applied to multiplexer 205 correspond to a plurality of ranges in range searcher 213. Range searcher 213 thus determines a range associated with the magnitude of the error signal, and via the control signal on line 215 causes multiplexer 205 to output the corresponding adjustment value. Range searcher 213 and multiplexer 205 cooperate to provide for adjustment values wherein the magnitude of the adjustment value provided by multiplexer 205 is greater when the error value is greater, and the magnitude of the adjustment value provided by multiplexer 205 is smaller when the error value is smaller. Further, the adjustment values are preferably distributed such that the difference between magnitudes of two neighboring adjustment values is small for adjustment values corresponding to small error values, while the difference between magnitudes of two neighboring adjustment values is great for adjustment values corresponding to large error values. Thus, when error values are large, aggressive adjustment will take place, and when error values are small, unagressive adjustment will take place. Of course, an adjustment value of zero may be used to correspond to errors in the smallest range.

Figure 2:
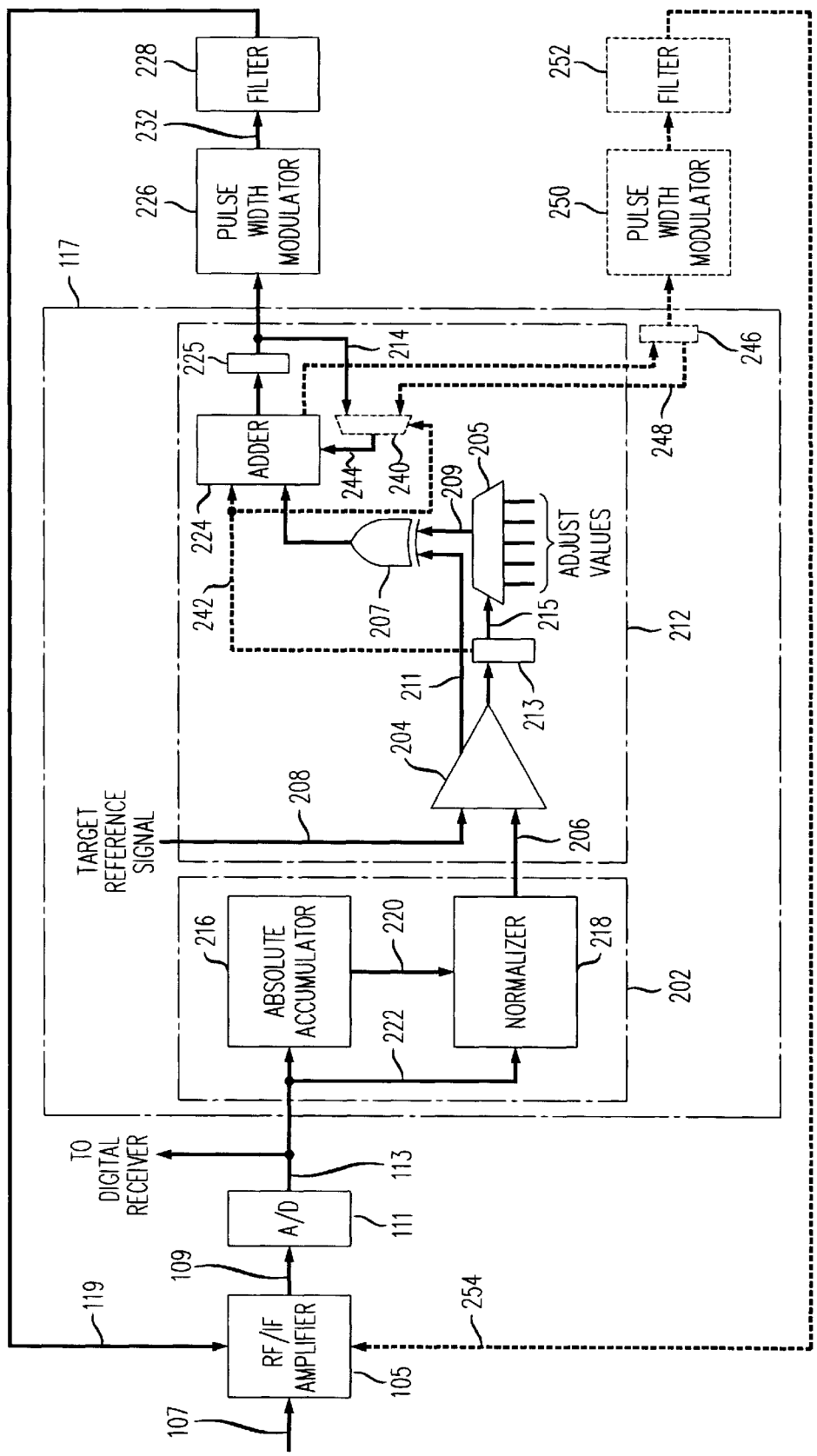
FIG. 2 is a simplified block diagram showing a second embodiment according to the invention.

Optionally, as shown in dotted lines in FIG. 2, coarse AGC circuit 117 may also include RF gain adjustment circuitry, comprising a multiplexer 240, an RF gain register 246, an RF pulse width modulator 250, an RF filter 252, and an RF control line 254. In this case, range searcher 213 determines if IF gain adjustment or RF gain adjustment will occur, based on the magnitude of the error signal. For example, first and second error thresholds are established. The first threshold is a large magnitude positive value, and the second threshold is a large magnitude negative value. If the error value is greater than the first threshold or less than the second threshold, then RF gain adjustment occurs. On the other hand, if the error value is between the first threshold and the second threshold, then IF gain adjustment occurs.

Range searcher 213 sends a signal to adder 224 and to a select input of multiplexer 240 informing them of the gain adjustment status (IF or RF) on line 242, in addition to the control signal sent to multiplexer 205 on line 215. Based on this signal, adder 224 is either accumulating an IF gain value via IF gain register 225, feedback line 214, multiplexer 240 and feedback line 244, or is accumulating an RF gain value via RF gain register 246, feedback line 248, multiplexer 240 and feedback line 244.

In its simplest form, the RF gain adjustment circuitry sends a DC signal (RFgain) via line 254 to an RF portion of RF/IF amplifier 105, and increases or decreases the magnitude of the DC signal by a fixed RFgain adjustment value, $\Delta$, whenever the absolute average signal is not between the first and second thresholds, according to the following equations:

$$RFgain_n = RFgain_{(n-1)} - \Delta, \text{ when error>threshold 1, and}$$

$$RFgain_n = RFgain_{(n-1)} + \Delta, \text{ when error<threshold 2.}$$

The RF gain adjustment value can, of course, be adaptively adjusted based on how far the magnitude of the error signal falls outside the range established by the thresholds.

Figure 3:
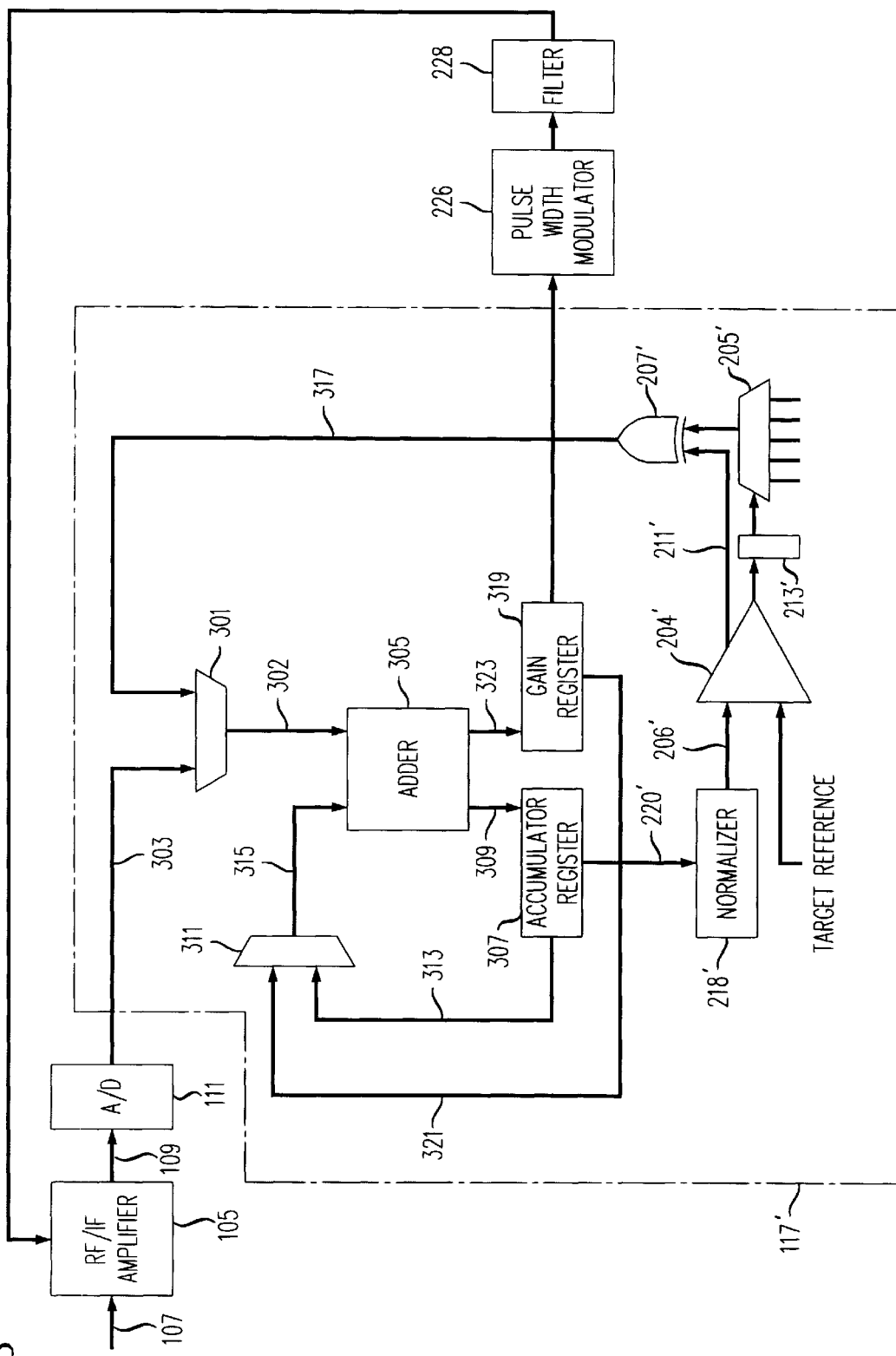
FIG. 3 is a simplified block diagram showing a third embodiment according to the invention.

In FIG. 3, another alternative coarse AGC circuit 117' achieves the functionality of coarse AGC circuit 117 of FIG. 1 but shares the use of an adder between the absolute accumulator and the updating circuit. RF/IF amplifier 105 and analog-to-digital converter 111 function in the same way as in the circuit of FIG. 2, and therefore have like designations. Similarly, pulse width modulator 226 and filter 228 perform in the same manner as in the circuit of FIG. 1, and therefore have like designations. The functionality of averaging block 202 and updating circuit 212 are accomplished in coarse AGC circuit 117' by an adder 305 operating alternatively in an absolute accumulation mode and an updating mode, two multiplexers 301 and 311, two registers 307 and 319, a normalizer 218', a comparator 204', a range searcher 213', an adjustment value multiplexer 205', and a +/- selector 207'.

Digital samples from analog-to-digital converter 111 are received by multiplexer 301 via line 303. Multiplexer 301 passes these digital samples to adder 305, via line 302, when adder 305 is in the absolute accumulation mode, during which adder 305 acts in the same manner as absolute accumulator 216 of FIG. 1. During the absolute accumulation mode, adder 305 provides updated accumulation values to register 307 via line 309. Register 307 also provides the previous accumulated value to multiplexer 311 via line 313, and multiplexer 311 passes the previous accumulated value to adder 305 via line 315.

When a block of values are accumulated in register 307, register 307 passes the absolute accumulation value to normalizer 218' via line 220'. Normalizer 218' converts the absolute accumulation value to an absolute average value by, for example, shifting an appropriate number of bits corresponding to the size of the block of samples, and provides the absolute average value to comparator 204' via line 206'.

Comparator 204' compares the absolute average value to the target reference value and provides an error signal to range searcher 213', and a sign bit to selector 207' via line 211'. Range searcher 213' provides a control signal to multiplexer 205', which provides the appropriate adjustment value to selector 207'. Selector 207' complements the adjustment value when the target reference value is less than the absolute average value and provides the complemented adjustment value to multiplexer 301 via line 317. When the target reference value is greater than the absolute average value, selector 207' passes the adjustment value unchanged to multiplexer 301 via line 317.

Multiplexer 301 passes the adjustment value to adder 305 via line 302 when adder 305 is in the updating mode. In this mode, adder 305 also receives a previous gain value from register 319 via line 321, multiplexer 311 and line 315. Adder 305 adjusts the previous gain value by adding the previous gain value with the adjustment value (either complemented or uncomplemented), and forwards the updated gain value to register 319 via line 323. Until its next update, the gain value stored in register 319 controls the IF portion of RF/IF amplifier 105 via pulse width modulator 226 and filter 228.

The coarse AGC circuit of FIG. 3, in an alternative configuration, can also include RF control circuitry like that described above with respect to FIG. 2. Thus, circuit 117' can be modified to provide for either RF control or IF control based on the magnitude of the error signal produced by comparator 204'.

In the above examples, the adjustment value multiplexer, 205 (FIGS. 1 and 2) and 205' (FIG. 3) outputs the adjustment value based on the control signal provided by the range searcher (213 or 213'), which in turn is based on the difference between the absolute average signal and the reference signal. The adjustment value is preferably one of a plurality of discrete values each associated with a corresponding error range as determined by the range searcher. For example, a plurality of thresholds, such as, for example, five thresholds, can be established within the range searcher. In this example, each of the five thresholds represents a different value, such that the fifth threshold is greater than the fourth threshold, the fourth threshold is greater than the third threshold, the third threshold is greater than the second threshold, and the second threshold is greater than the first threshold. These five thresholds define six ranges. The first range is associated with differences that are less than the first threshold. The second range is associated with differences that are between the first threshold and the second threshold. The third range is associated with differences that are between the second threshold and the third threshold. The fourth range is associated with differences that are between the third threshold and the fourth threshold. The fifth range is associated with differences that are between the fourth threshold and the fifth threshold. Finally, the sixth range is associated with differences that are greater than the fifth threshold.

According to the invention, each of the six ranges has a corresponding adjustment value. Thus, if the error signal is in the first range, a first adjustment value is output as the adjustment signal. Similarly, if the error signal is in the second range, a second adjustment value is output as the adjustment signal. Third, fourth, fifth and sixth adjustment values are similarly associated with the third, fourth, fifth and sixth ranges. According to the invention, the first adjustment value is relatively small and the sixth adjustment value is relatively large. Further, the second through fifth adjustment values range between the first and sixth adjustment values in ascending order. As a result, when the difference value is in the first range, the previous gain value is modified slightly, or not at all. Conversely, a large difference, such as a difference in the fifth or sixth range, will yield a large change in the gain value resulting in a correspondingly large change in the DC signal provided to RF/IF amplifier 105. Operationally, larger differences will be expected in the initial stages of signal acquisition. Eventually, the differences should progress from the higher ranges down to the first range such that the system automatically enters a fine tracking mode wherein the control signal is unchanged or is only changed slightly.

The use of five thresholds to create six ranges is merely by way of example, and not of limitation. Of course, a greater or smaller number of thresholds can be utilized to yield correspondingly a greater or smaller number of ranges.

What is claimed is:

1. An automatic gain control circuit, comprising:
   an averaging block adapted to receive a length of a digital sample stream representing an incoming analog signal and produce an absolute average signal; and
   an adjustment block adapted to receive the absolute average signal and a reference signal and produce an adjustment signal, the adjustment signal being based on a difference between the absolute average signal and the reference signal,
   wherein the adjustment block includes an adder adapted to receive a previous gain value and the adjustment signal and output an updated gain value as a sum of the previous gain value and the adjustment signal.

2. An automatic gain control circuit as recited in claim 1, wherein the averaging block and the adjustment block share an adder.

3. An automatic gain control circuit as recited in claim 1, wherein the averaging block comprises an absolute accumulator and a normalizer, the absolute accumulator being adapted to produce an absolute accumulation signal by accumulating absolute values of digital samples within the length of the digital sample stream, and the normalizer being adapted to adjust the absolute accumulation signal to produce the absolute average signal based on a number of absolute values accumulated by the absolute accumulator into the absolute accumulation signal.

4. An automatic gain control circuit as recited in claim 3, wherein the normalizer is a shifter, such that the normalizer is adapted to shift the absolute accumulation signal to produce the absolute average signal based on the number of absolute values accumulated by the accumulator into the absolute accumulation signal.

5. An automatic gain control circuit as recited in claim 1, wherein the adjustment signal has one of a plurality of values each associated with a corresponding range of the difference between the absolute average signal and the reference signal, such that the adjustment signal has a larger value if the difference is in a first range corresponding to a large difference between the absolute average signal and the reference signal, and the adjustment signal has a smaller value if the difference is in a second range corresponding to a small difference between the absolute average signal and the reference signal.

6. An automatic gain control circuit as recited in claim 5, wherein the adjustment signal has a zero value if the difference is in a third range indicating very little if any difference between the absolute average signal and the reference signal.

7. An automatic gain control circuit as recited in claim 1, further comprising:
- a pulse width modulator adapted to receive the updated gain value and produce a PWM signal; and
- a filter adapted to receive the PWM signal and produce a DC control voltage as the control signal.

8. An automatic gain control circuit as recited in claim 7, further comprising an amplifier adapted to receive the DC control voltage, the gain of an incoming signal being controlled by the amplifier according to the DC control voltage in order to control the incoming signal.

9. In a receiver having an RF section and an IF section, an automatic gain control circuit coupled to provide control signals to an amplifier for use in adjusting an amplitude of a signal output from the amplifier, comprising:
- an IF gain adjustment block adapted to receive digital samples representing the amplitude of the signal output from the amplifier, and adapted to update an IF control signal based on a difference between an average amplitude and a target amplitude if the difference is between a first threshold value and a second threshold value; and
- an RF gain adjustment block adapted to update an RF control signal based on the difference between the average amplitude and the target amplitude if the difference is not between the first and second threshold values, wherein the IF gain adjustment block comprises:
- an absolute accumulator adapted to receive the digital samples and accumulate the absolute values of the digital samples for a block of samples of a given block size;
- a normalizer adapted to receive an absolute accumulation signal from the absolute accumulator and provide the average amplitude signal by adjusting the absolute accumulation signal based on the number of samples in the given block size;
- a comparator adapted to compare the average amplitude signal to the target amplitude;
- a multiplexer adapted to receive an error signal from the comparator and output an adjustment value based on the error signal;
- a selector adapted to receive the adjustment value from the multiplexer and a sign bit from the comparator and to modify the adjustment value based on the sign bit; and
- an adder adapted to receive the modified adjustment value from the selector and combine the modified adjustment value with a previous control value.

10. An automatic gain control circuit as recited in claim 9, wherein the selector modifies the adjustment value by performing an exclusive-OR operation between the adjustment value and the sign bit.

11. An automatic gain control circuit as recited in claim 9, wherein the selector modifies the adjustment value by complementing the adjustment value when the sign bit is a logic 1.

12. In a receiver having an RF section and an IF section, an automatic gain control circuit, comprising:
- an IF gain adjustment block adapted to receive digital samples representing the amplitude of the signal output from the amplifier, and adapted to update an IF control signal based on a difference between an average amplitude and a target amplitude if the difference is between a first threshold value and a second threshold value; and
- an RF gain adjustment block adapted to update an RF control signal based on the difference between the average amplitude and the target amplitude if the difference is not between the first and second threshold values, wherein the RF gain adjustment block comprises:
- an absolute accumulator adapted to receive the digital samples and accumulate the absolute values of the digital samples for a block of samples of a given block size;
- a normalizer adapted to receive an absolute accumulation signal from the absolute accumulator and provide the average amplitude signal by adjusting the absolute accumulation signal based on the number of samples in the given block size;
- a comparator adapted to compare the average amplitude signal to the target amplitude;
- a multiplexer adapted to receive an error signal from the comparator and output an adjustment value based on the error signal;
- a selector adapted to receive the adjustment value from the multiplexer and a sign bit from the comparator and to modify the adjustment value based on the sign bit; and
- an adder adapted to receive the modified adjustment value from the selector and combine the modified adjustment value with a previous control value.

13. An automatic gain control circuit as recited in claim 12, wherein the selector modifies the adjustment value by performing an exclusive-OR operation between the adjustment value and the sign bit.

14. An automatic gain control circuit as recited in claim 12, wherein the selector modifies the adjustment value by complementing the adjustment value when the sign bit is a logic 1.

15. A method of controlling gain of an incoming signal by an amplifier, comprising the steps of:
- calculating an absolute average of a series of samples representing the incoming signal;
- comparing the absolute average to a reference to produce an adjustment value based on a difference between the absolute average and the reference,
- receiving a previous gain value;
- producing an updated gain value as a sum of the previous gain value and the adjustment signal; and
- controlling the gain of the amplifier based on the updated gain value.

16. A method as recited in claim 15, wherein the calculating step comprises the steps of:
- accumulating absolute values of digital samples within a length of a digital sample stream representing the incoming signal, to produce an accumulated value; and
- normalizing the accumulated value based on a number of absolute values accumulated.

17. A method as recited in claim 16, wherein the normalizing step comprises shifting the accumulated value based on the number of absolute values accumulated.

18. A method as recited in claim 15, wherein the comparing step comprises the steps of:
- determining the difference between the absolute average and the reference;
- identifying a difference range that includes the determined difference; and
- setting the adjustment value based on the identified difference range.

19. A method as recited in claim 18, wherein the step of setting the adjustment value comprises the step of selecting a predetermined adjustment value corresponding to the identified difference range.

20. A method as recited in claim 19, wherein each difference range has a corresponding adjustment value, and wherein the adjustment value corresponding to a large difference range is greater than the adjustment value corresponding to a small difference range.

21. An integrated circuit, including an automatic gain control circuit, comprising:

an averaging block adapted to receive a length of a digital sample stream representing an incoming analog signal and produce an absolute average signal;

an adjustment block adapted to receive the absolute average signal and a reference signal and produce an adjustment signal, the adjustment signal being based on a difference between the absolute average signal and the reference signal; and an adder adapted to receive a previous gain value and the adjustment signal and output an updated gain value as a sum of the previous gain value and the adjustment signal.

22. An integrated circuit as recited in claim 21, wherein the averaging block and the adjustment block share an adder.

23. An integrated circuit as recited in claim 21, wherein the averaging block comprises an absolute accumulator and a normalizer, the absolute accumulator being adapted to produce an absolute accumulation signal by accumulating absolute values of digital samples within the length of the digital sample stream, and the normalizer being adapted to adjust the absolute accumulation signal to produce the absolute average signal based on a number of absolute values accumulated by the absolute accumulator into the absolute accumulation signal.

24. An integrated circuit as recited in claim 23, wherein the normalizer is a shifter, such that the normalizer is adapted to shift the absolute accumulation signal to produce the absolute average signal based on the number of absolute values accumulated by the accumulator into the absolute accumulation signal.

25. An integrated circuit as recited in claim 21, further comprising:

a pulse width modulator adapted to receive the updated signal and produce a PWM signal; and a filter adapted to receive the PWM signal and produce a DC control voltage as the control signal.

* * * * *